(12) United States Patent
Roberts

(10) Patent No.: US 6,321,739 B1
(45) Date of Patent: Nov. 27, 2001

(54) FILM FRAME SUBSTRATE FIXTURE

(75) Inventor: Jay W. Roberts, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/293,151

(22) Filed: Apr. 16, 1999

(51) Int. Cl.$^7$ ........................................................ B28D 7/04
(52) U.S. Cl. .............................................. 125/35; 451/388
(58) Field of Search ........................ 451/388; 125/13.01, 125/35; 269/21

(56) References Cited

U.S. PATENT DOCUMENTS

| | | | |
|---|---|---|---|
| 3,809,050 | * | 5/1974 | Chough et al. ........................ 125/35 |
| 3,976,288 | * | 8/1976 | Cuomo, Jr. ............................. 269/21 |
| 4,579,527 | | 4/1986 | Wedel et al. . |
| 4,600,936 | * | 7/1986 | Khoury et al. ........................ 357/79 |
| 4,791,721 | | 12/1988 | Anderson et al. . |
| 5,134,912 | | 8/1992 | Simmons . |
| 5,286,679 | | 2/1994 | Farnworth et al. . |
| 5,315,749 | | 5/1994 | Nenadic et al. . |
| 5,397,856 | | 3/1995 | Lee . |
| 5,461,328 | | 10/1995 | Devereaux et al. . |
| 5,501,436 | | 3/1996 | Miller . |
| 5,553,766 | | 9/1996 | Jackson et al. . |
| 5,589,000 | | 12/1996 | Harms et al. . |
| 5,618,759 | * | 4/1997 | Boysel ................................. 438/464 |
| 5,730,113 | | 3/1998 | Wildes et al. . |
| 5,785,518 | | 7/1998 | Koshak . |
| 5,809,987 | * | 9/1998 | Wark et al. ............................ 125/35 |
| 5,833,073 | | 11/1998 | Schatz et al. . |
| 6,024,631 | * | 2/2000 | Piper ..................................... 451/41 |
| 6,165,232 | * | 12/2000 | Tieber et al. ........................ 451/388 |

* cited by examiner

Primary Examiner—Robert A. Rose
(74) Attorney, Agent, or Firm—Dickstein Shapiro Morin & Oshinsky LLP

(57) ABSTRACT

The present invention provides a fixture for mounting a substrate to mounting tape on a film frame so as to retain the substrate to the film frame for dicing. A plurality of grooves for receiving a cutting saw extend longitudinally and transversely across the fixture to define die regions. The fixture also includes a plurality of apertures that align with the substrate and with dies to be cut from the substrate. The aligned apertures supply vacuum to the substrate to retain the substrate and cut dies in the fixture. When the dicing is completed, the vacuum is turned off and the individual dies can be readily removed from the fixture.

15 Claims, 6 Drawing Sheets

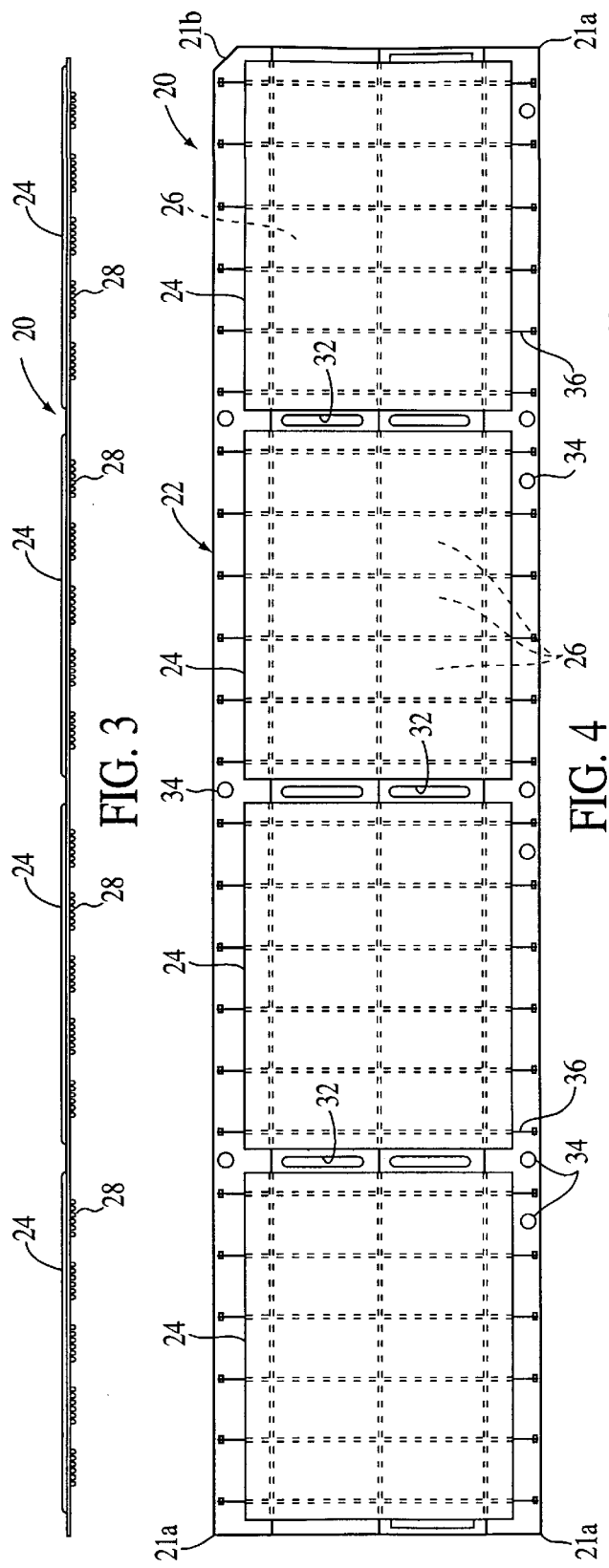
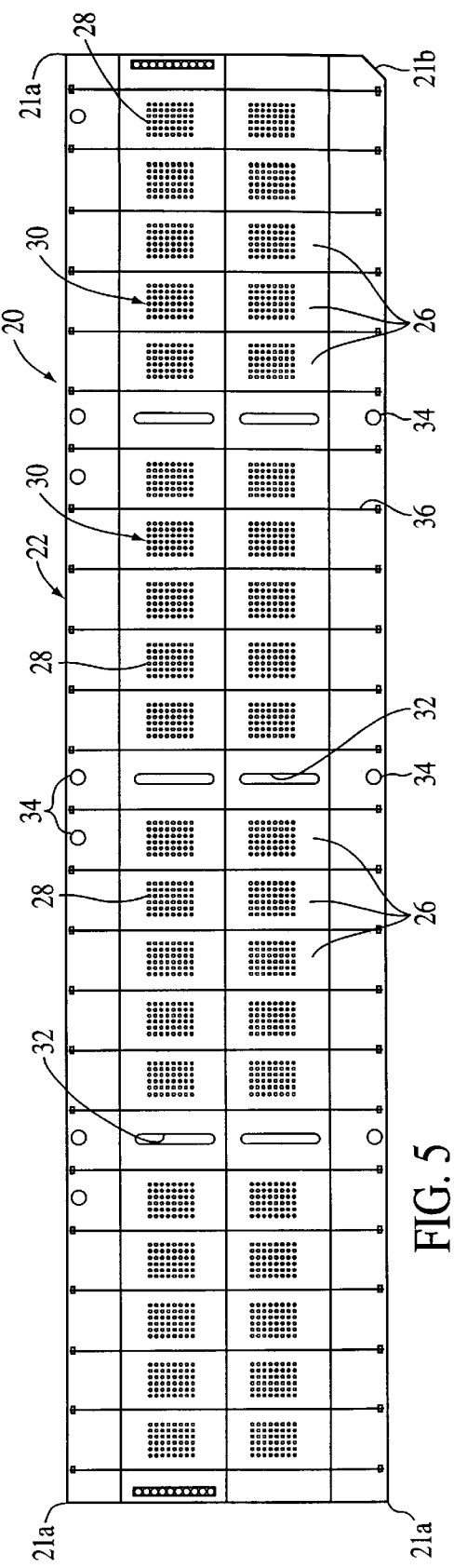
FIG. 3
FIG. 4
FIG. 5

FILM FRAME SUBSTRATE FIXTURE

BACKGROUND OF THE INVENTION

1. Field of the Invention

The present invention relates generally to material handling machines for dicing semiconductor substrates. More particularly, the invention relates to film frames for holding substrates for dicing and, still more particularly, to fixtures coupled to the film frame for receiving and retaining the substrate in position on the film frame.

2. Description of the Related Art

Conventional substrate dicing machines include a film frame coupled to a chuck by vacuum. The film frame includes a frame and mounting tape stretched across the frame. Typically, the mounting tape is a polymer film having an adhesive surface for holding a substrate to be diced.

In conventional operation, a substrate is mounted on the mounting tape and the film frame is mounted on the chuck. Vacuum is applied to the bottom of the mounting tape. The vacuum stabilizes the mounting tape in the vertical direction. When the substrate has been diced, the film frame and substrate must be processed to remove the individual dies from the mounting tape. Unfortunately, dedicated equipment is required to remove the tape from the film frame. Moreover, the dedicated equipment is expensive and takes up valuable floor space. In addition, the tape removing process adds manufacturing steps, and the mounting tape is consumed during the dicing process, adding to the cost of producing products which incorporate the diced dies.

SUMMARY OF THE INVENTION

The present invention overcomes the above-cited disadvantages by providing a fixture that is mounted to the film frame by mounting tape. The fixture includes a recess configured to receive a substrate for dicing. A plurality of grooves for receiving a cutting saw extend longitudinally and transversely across the fixture to define die regions. As the cutting saw moves over the substrate and along the grooves, the substrate is diced into individual dies. The film frame, fixture and tape are reusable with other substrates The fixture may also include a plurality of apertures that align with one or more apertures formed in the mounting tape. The aligned apertures supply vacuum to the substrate from a vacuum source which retains the substrate in the fixture and which also retains the dies in place in the fixture after dicing. When the dicing is completed, the vacuum is turned off and the individual dies can be readily removed from the fixture.

The invention advantageously reduces the number of manufacturing steps involved in the production of the dies. Moreover, since the cutting saw moves along the grooves, the fixture is not destroyed in the dicing process and can be reused, and since the fixture allows the saw to dice the substrate without destroying the mounting tape, the mounting tape is not consumed in the process, thereby further reducing material costs.

These and other features and advantages of the invention will become more readily apparent from the following detailed description of preferred embodiments of the present invention which is provided in connection with the accompanying drawings.

BRIEF DESCRIPTION THE DRAWINGS

FIG. 3 is a side view of a substrate to be diced.

FIG. 4 is a top plan view of the substrate of FIG. 3.

FIG. 5 is a bottom plan view of the substrate of FIG. 3

DETAILED DESCRIPTION OF PREFERRED EMBODIMENTS

Figure 2:
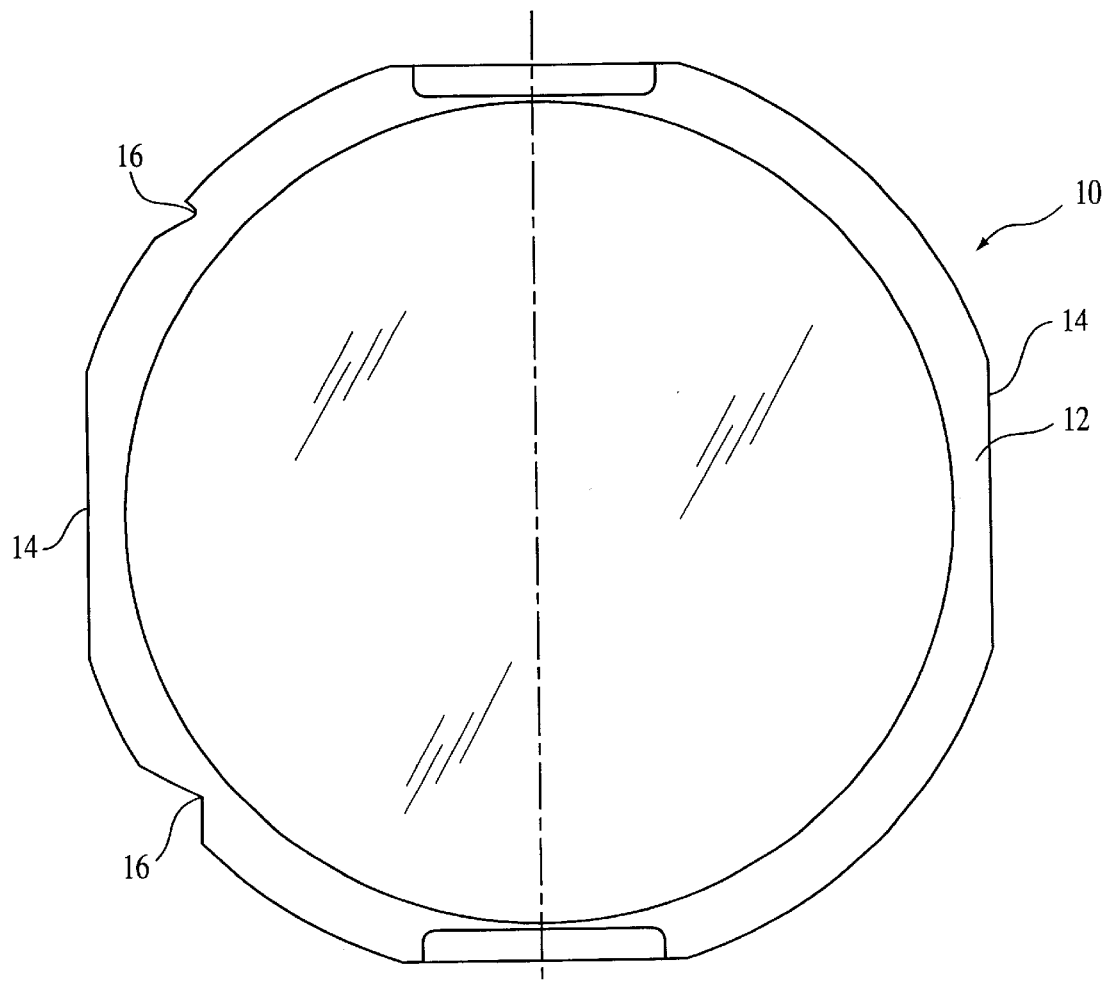
FIG. 2 is a plan view of a film frame.

A conventional film frame 10 for use in dicing a substrate is illustrated in FIG. 2. The frame 10 includes a generally annular plate 12 having a pair of flats 14 on opposite sides of the plate 12 and a pair of positioning notches 16 for receiving guide pins (not shown). In operation, a film having an adhesive surface for supporting a substrate is stretched across the frame 10. The frame 10 is mounted on the dicing machine 15 and mechanical clamps retain the frame 10 in position.

Although the subsequent description shows a particular type of substrate, e.g., an encapsulated substrate that includes a plurality of chip packages having ball grid array connectors, the substrate shown is merely exemplary. The invention can be used with a wide variety of substrates, including semiconductor wafers, or portions thereof.

A substrate 20 to be diced is illustrated in FIGS. 3–5. The illustrated substrate 20 is a forty unit overmolded panel and includes a panel 22 divided into four overmolded segments 24. Each segment 24 will produce ten individual encapsulated packages 26 when diced. Each of the packages has a plurality of contacts in the form of solder balls 28 formed as a ball grid array (BGA) or fine pitch ball grid array (FBGA) 30 on the bottom of the panel 22, i.e., beneath each package 26. The panel 22 further includes apertures 32 disposed between adjacent segments 24 and apertures 34 disposed along the longitudinal edges of the panel 22. A plurality of cutting saw alignment marks 36 extend longitudinally and transversely across the panel 22. The substrate 20 has three square corners 21a and a beveled corner 21b for orientation of the substrate 20 in a fixture 40 described below.

Figure 1:
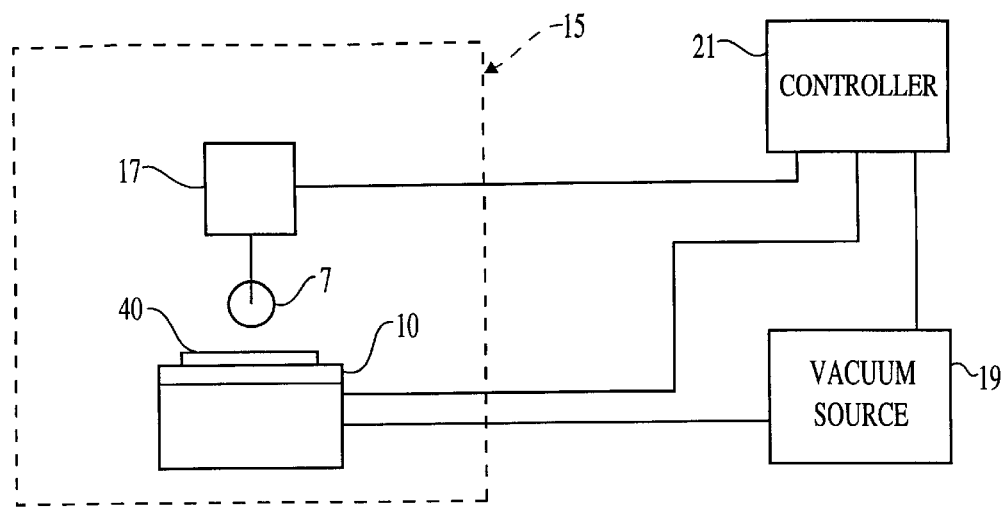
FIG. 1 is a schematic of a dicing machine coupled to a vacuum source and a controller.
Figure 6:
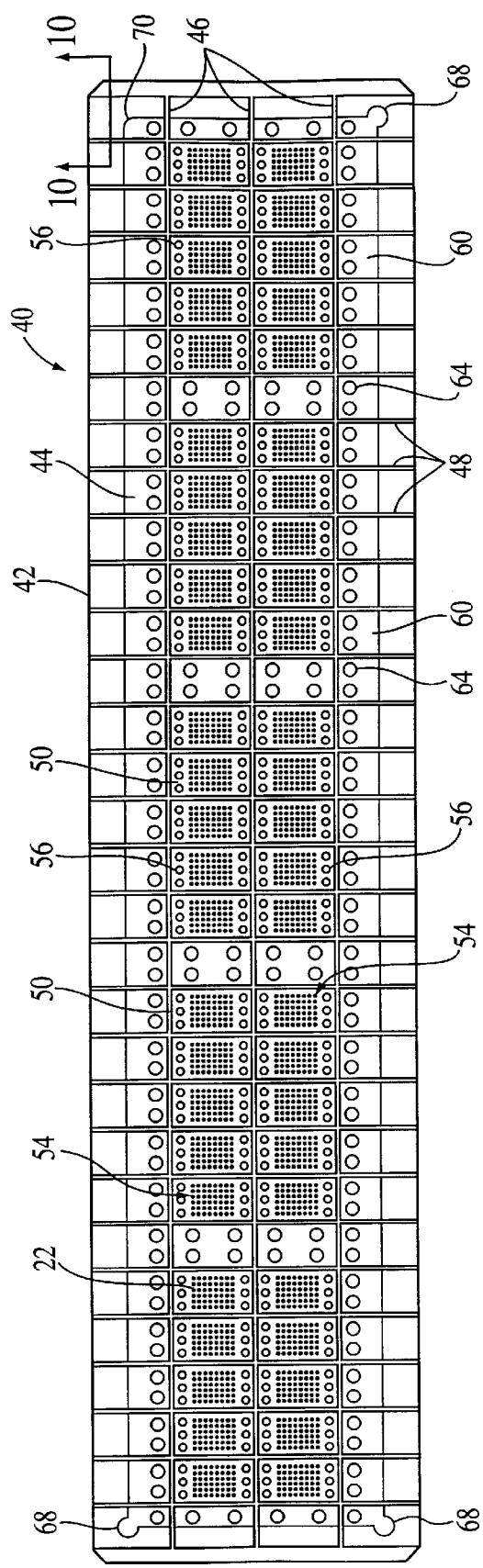
FIG. 6 is a top plan view of a fixture for receiving the substrate of FIG. 3 in a contact down orientation.
Figure 7:
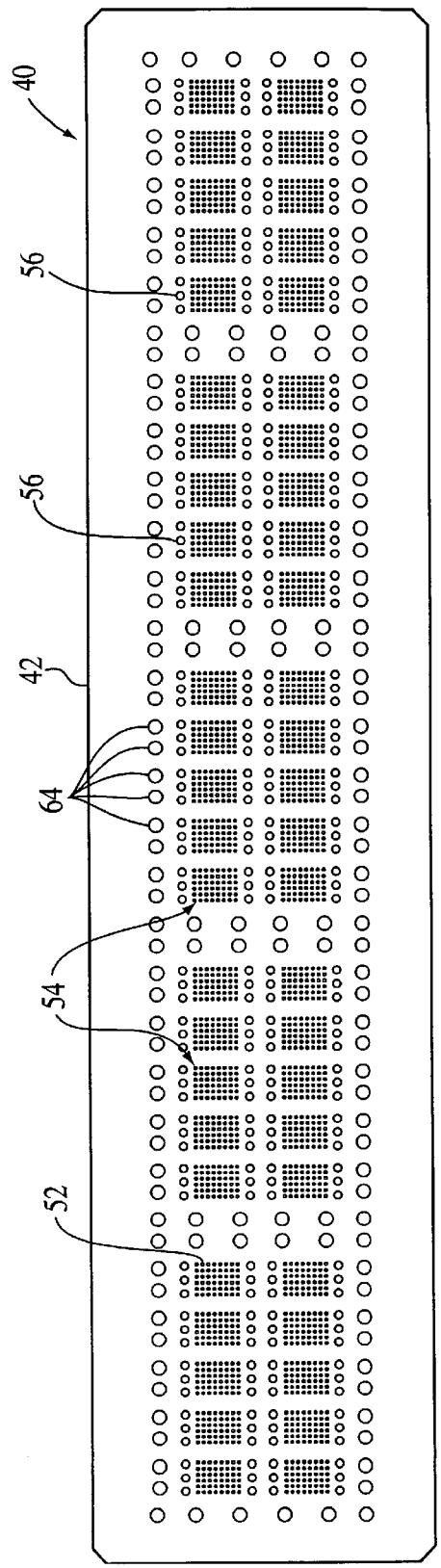
FIG. 7 is a bottom plan view of the fixture of FIG. 6.
Figure 8:
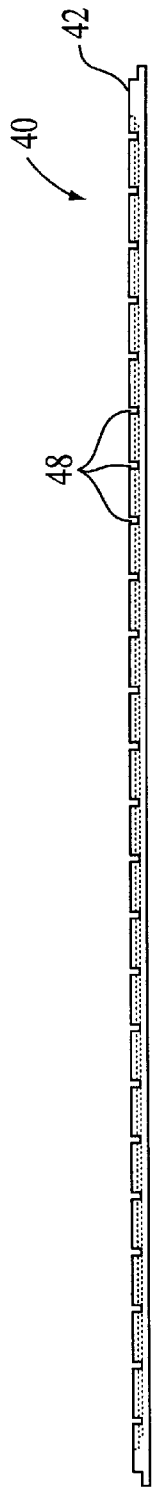
FIG. 8 is a side view of the fixture of FIG. 6.
Figure 9:
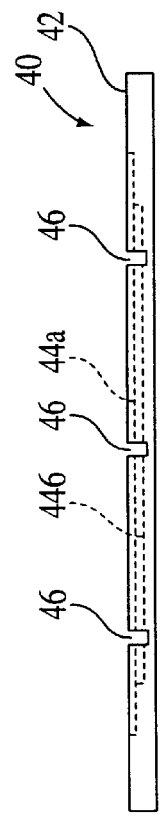
FIG. 9 is an end view of the fixture of FIG. 6.
Figure 10:
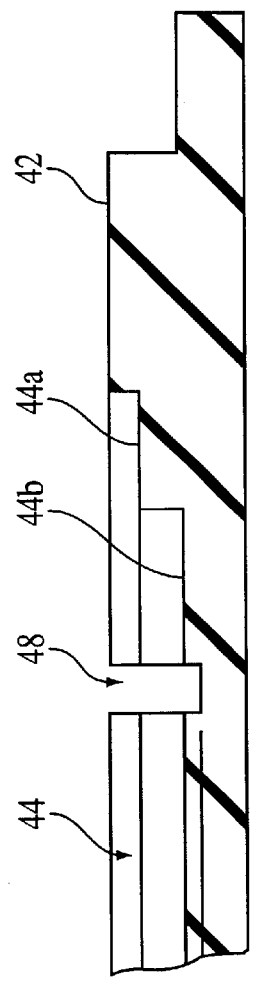
FIG. 10 is a section view taken along line 10—10 of FIG. 6.
Figure 11:
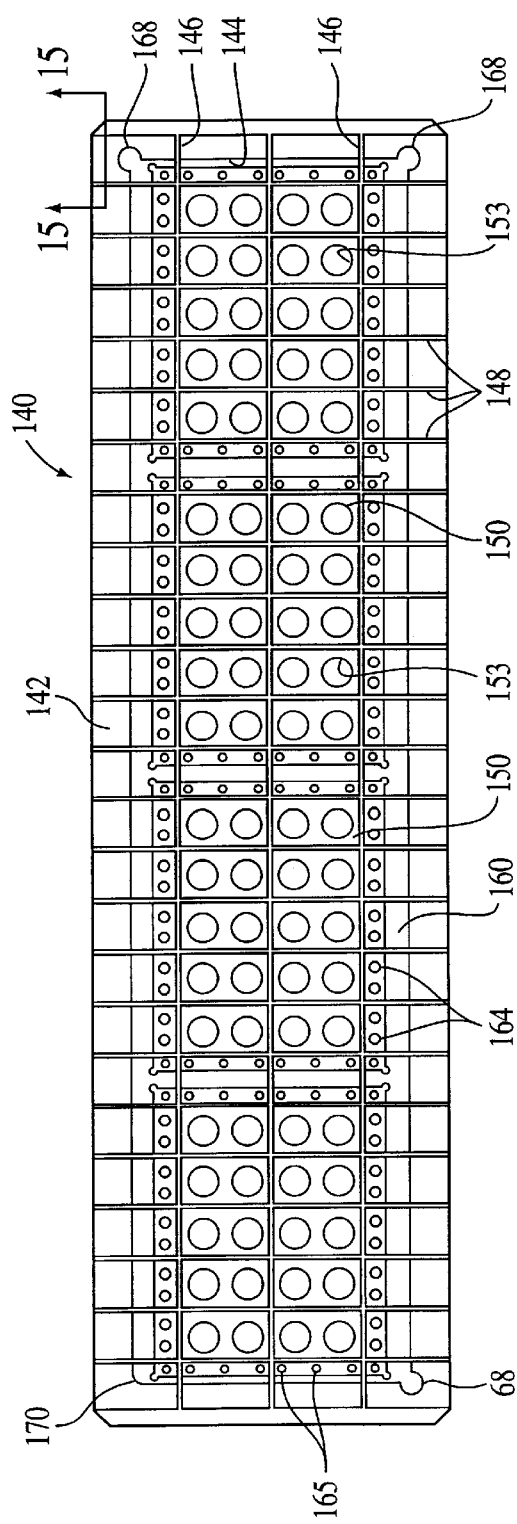
FIG. 11 is a top plan view of a fixture for receiving the substrate of FIG. 3 in a contact up orientation.
Figure 12:
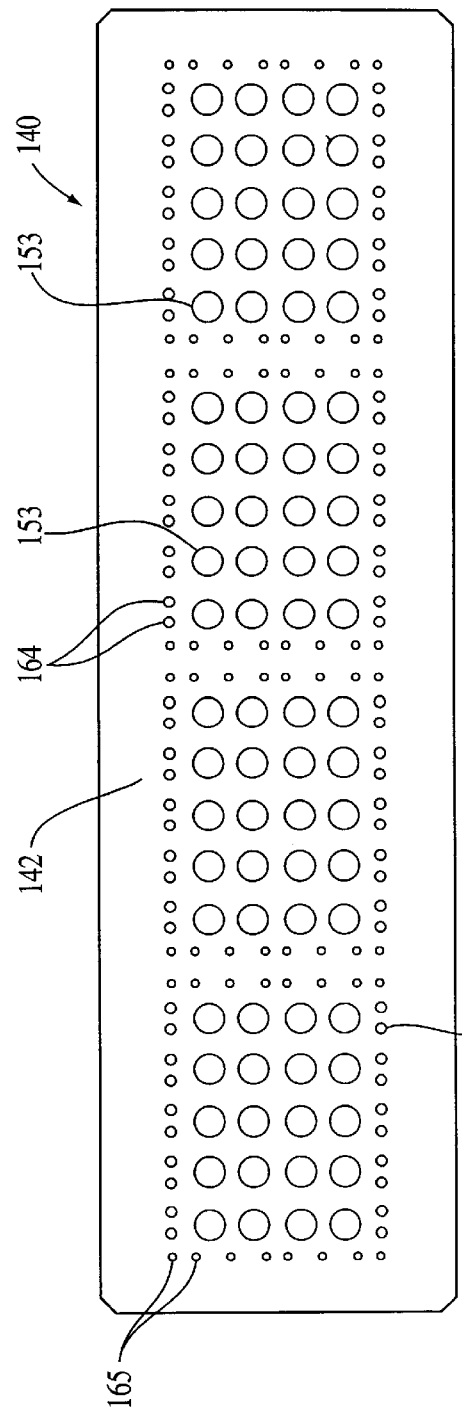
FIG. 12 is a bottom plan view of the fixture of FIG. 11.
Figure 13:
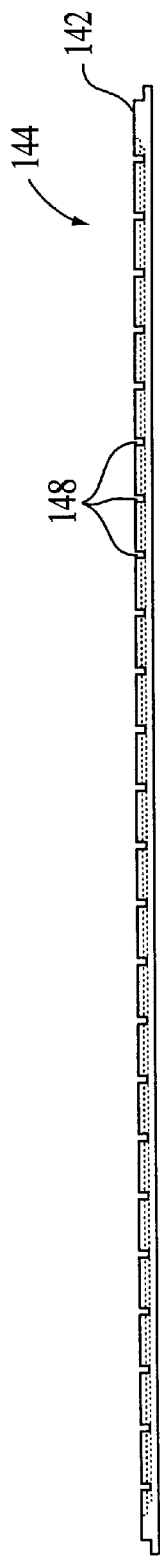
FIG. 13 is a side view of the fixture of FIG. 11.
Figure 14:
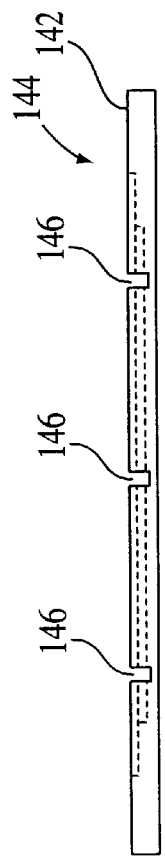
FIG. 14 is an end view of the fixture of FIG. 11.
Figure 15:
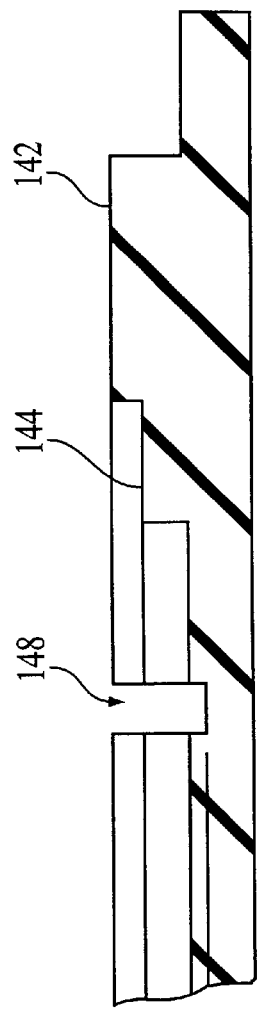
FIG. 15 is a section view taken along line 15—15 of FIG. 11.

FIGS. 6–10 illustrate a first embodiment of a fixture 40 for receiving the substrate 20 in a "contacts down" configuration. The fixture 40 includes a plate 42 having a two-stage central recessed area 44 (FIG. 10), a plurality of longitudinal grooves 46 (FIGS. 6 and 9), and a plurality of transverse grooves 48 (FIGS. 6 and 10). The recessed area 44 is sized and configured to receive the substrate 20 and includes a shallow panel-receiving region 44a and a deeper contact-receiving region 44b. The grooves 46, 48 cooperate to define a plurality of die regions 50 that are disposed to align with the packages 26 on the substrate 20. The grooves 46, 48 are sized to receive the blade of a cutting saw 17 and extend below the level of the contact-receiving region 44b, so that the cutting saw 17 cuts completely through a panel 22 disposed in the recessed area 44 without contacting any part of fixture 40. A controller 21 (FIG. 1) controls the positioning of the cutting saw 17 in the grooves 46, 48 and the movement of the saw 17 to cut the substrate 20.

Each die region 50 includes a plurality of apertures 52 formed as an aperture array 54. The aperture array 54 matches the BGA 30 beneath each package 26 so that each ball 28 in the BGA 30 fits into one of the apertures 52 of the aperture array 54. An additional plurality of apertures 56 are formed in each die region 50 for supplying vacuum from a vacuum source 19 to retain each package 26 in the fixture 40 during and after dicing.

The grooves 46, 48 further define a plurality of non-die regions 60 disposed along the periphery of the panel 22 and between the segments 24. The non-die regions 60 include apertures 64 for supplying vacuum to retain the non-die regions of the substrate 20 in the fixture during and after dicing.

The recessed area 44a includes three circular corners 68 for receiving square corners 21a on the substrate 20. The fourth corner 70 is rounded for receiving a shaped corner 21b on the substrate 20. The corners 68, 70 cooperate to ensure that the substrate 20 is properly oriented in the fixture 40.

FIGS. 11–15 illustrate a second embodiment of the fixture 140 for use in dicing the substrate 20. The fixture 140 includes a plate 142 having a one-stage central recessed area 144, a plurality of longitudinal grooves 146, and a plurality of transverse grooves 148. The recessed area 144 is sized and configured to receive the substrate 20 in a "contact up" configuration, wherein the encapsulant is disposed in the recessed area 144. The grooves 146, 148 cooperate to define a plurality of die regions 150 that are disposed to align with the packages 26 on the substrate. The grooves 146, 148 are sized to receive a cutting saw 17 and extend below the level of the recessed area 144, so that the cutting saw cuts completely through a panel 22 disposed in the recessed area 144 without contacting the fixture 140.

Each die region 150 includes a pair of apertures 153 for supplying vacuum to retain each package 26 in the fixture during and after dicing. The grooves 146, 148 further define a plurality of non-die regions 160 disposed along the periphery of the panel 22 and between the segments 24. The non-die regions 160 include apertures 164 and 165 for supplying vacuum to retain the non-die regions of the substrate 20 in fixture 140 during and after dicing.

The recessed area 144a includes three circular corners 168 for receiving square corners 21a on the substrate 20. The fourth corner 170 is rounded for receiving a shaped corner 21b on the substrate. The corners 168, 170 cooperate to ensure that the substrate 20 is properly oriented in the fixture 40.

The use of the FIGS. 4–15 fixtures will now be described. One of the fixtures (FIGS. 6–10) is used for a contacts shown dicing, while the other fixture (FIGS. 11–15) is used for contact up dicing.

In use, mounting tape is stretched across the film frame 10 and the fixture 40 or 140 is mounted on the mounting tape. The tape is cut out beneath fixture 40 or 140 to allow apertures 56, 64, 153, 164, and 165 to receive a vacuum from the source 19 (FIG. 1) through the cut-out position of the tape (FIGS. 6–10). The film frame 10 is mounted on a chuck and a substrate 20 is positioned in the recess 44 or 144. Vacuum is then applied to the substrate 20 through the cutout in the tape and through the apertures in fixture 40 or 140 to retain the substrate 20 on the fixture 40 or 140. The cutting saw is then moved through the grooves 46, 48 or 146, 148 to dice the substrate 20. After the substrate has been diced, the vacuum is turned off and the film frame 10 is removed from the chuck and the individual dies easily removed from the fixture 40 or 140 for further processing. The film frame is returned to the chuck, another substrate 20 mounted on the fixture 40 or 140 and vacuum reapplied to retain a new substrate 20 for dicing. It will be appreciated that the substrate can be mounted on the fixture before the fixture is mounted on the film. Moreover, the fixture can be mounted on the mounting tape before the film frame is mounted on the chuck. In other words, the precise sequence of steps is not essential.

The present invention provides a fixture for mounting a substrate to a film frame so as to retain the substrate for dicing without destroying the mounting tape during the dicing process. The fixture also reduces the number of manufacturing steps involved and eliminates the need for dedicated and expensive equipment. In particular, the invention has been described with respect to use with encapsulated substrates employing ball grid array contact packages which are to be diced from the substrate. However, as noted, any substrate can be diced using the fixture of the invention. For example, the invention can be used with differently shaped substrates or to dice semiconductor wafers of different sizes or shapes. Therefore, the scope of the present invention is not to be considered as limited by the specifics of the particular fixtures described above, but is only limited by the scope of the appended claims.

What is claimed is:

1. A substrate fixture comprising:
a plate having a recessed area for receiving a substrate therein, a plurality of longitudinal grooves, and a plurality of transverse grooves provided on an upper surface of said plate, the longitudinal and transverse grooves being provided on areas of said plate surrounding said recessed area and being sized to receive a substrate cutting saw, wherein said recessed area includes first and second predetermined shaped areas configured to receive first and second shaped portions formed on the substrate to provide for a single orientation for the substrate in the fixture.

2. The fixture of claim 1 wherein the longitudinal and transverse grooves extend downwardly below the level of the recessed area to allow the cutting saw to cut completely through a substrate received in said recessed area.

3. The fixture of claim 1 wherein the plate further includes a plurality of apertures extending through the plate in the recessed area.

4. The fixture of claim 3 wherein the longitudinal grooves and transverse grooves cooperate to define a plurality of die areas of said recessed area and the plurality of apertures includes at least one aperture disposed in each die area.

5. The fixture of claim 3 wherein the fixture is configured to receive a substrate having contacts thereon in a contact-up orientation.

6. The fixture of claim 3 wherein the fixture is configured to receive the substrate having contacts thereon in a contact down orientation, the fixture including a plurality of apertures formed into an aperture array.

7. The fixture of claim 6 wherein the recessed area includes a two step recess, a first step of the recess being configured to receive the substrate and a second step of the recess being configured to receive the contacts.

8. The fixture of claim 6 wherein said recessed area includes die areas, and wherein each die area includes a plurality of apertures for receiving contacts formed into a ball grid array.

9. The fixture of claim 6 wherein said recessed area includes die areas, and wherein each die area includes a plurality of apertures for receiving contacts formed into a fine pitch ball grid array.

10. The fixture of claim 4 wherein the longitudinal grooves and transverse grooves cooperate to define a plurality of non-die areas, each of the non-die areas including at least one aperture.

11. The fixture of claim 1 wherein said first predetermined shaped area comprises a corner having a first shape to receive said first shaped portion formed on the substrate and said second predetermined shaped area comprises a corner having a second shape different from said first shape to receive said second shaped portion formed on the substrate to provide for said single orientation for the substrate in the fixture.

12. The fixture of claim 5 wherein the recessed area includes a one-step recess.

13. The fixture of claim 11, wherein said recessed area includes three said first predetermined shaped areas and one said second predetermined shaped area.

14. The fixture of claim 13, wherein said first shaped portion formed on the substrate comprises a square corner and said second shaped portion comprises a non-square corner.

15. The fixture of claim 13, wherein said first predetermined shaped area comprises a circular area and said second predetermined shaped area comprises a rounded area.

* * * * *